United States Patent
Netzer et al.

(10) Patent No.: US 12,040,719 B2
(45) Date of Patent: Jul. 16, 2024

(54) ISOLATED PRIMARY SIDE SWITCHED CONVERTER

(71) Applicant: Tridonic GmbH & Co KG, Dornbirn (AT)

(72) Inventors: Harald Netzer, Nenzing (AT); Stefan Stark, Muntlix (AT)

(73) Assignee: Tridonic GmbH & Co KG, Dornbirn (AT)

( * ) Notice: Subject to any disclaimer, the term of this patent is extended or adjusted under 35 U.S.C. 154(b) by 198 days.

(21) Appl. No.: 17/765,179

(22) PCT Filed: Nov. 5, 2020

(86) PCT No.: PCT/EP2020/081124
§ 371 (c)(1),
(2) Date: Mar. 30, 2022

(87) PCT Pub. No.: WO2021/099131
PCT Pub. Date: May 27, 2021

(65) Prior Publication Data
US 2022/0393601 A1 Dec. 8, 2022

(30) Foreign Application Priority Data

Nov. 18, 2019 (EP) .................... 19209652

(51) Int. Cl.
*H05B 45/30* (2020.01)
*G11C 27/02* (2006.01)
(Continued)

(52) U.S. Cl.
CPC ......... *H02M 3/33571* (2021.05); *G11C 27/02* (2013.01); *H02M 1/0009* (2021.05);
(Continued)

(58) Field of Classification Search
CPC .... H05B 45/30; H05B 45/37; H05B 45/3725; H05B 45/382; H02M 3/01;
(Continued)

(56) References Cited

U.S. PATENT DOCUMENTS 9,924,571 B2 * 3/2018 Duenser ................. H05B 45/14
2017/0238379 A1 * 8/2017 Duenser ................. H02M 1/08
315/210

FOREIGN PATENT DOCUMENTS

CN 109462909 3/2019
DE 10 2014 214744 1/2016

OTHER PUBLICATIONS

EP Application No. 19 209 652.7, Search Report dated Aug. 18, 2022, 6 pages.
(Continued)

*Primary Examiner* — Long Nguyen
(74) *Attorney, Agent, or Firm* — Andrus Intellectual Property Law, LLP (57) ABSTRACT

The invention relates to an isolated resonant primary side switched converter (100), comprising a galvanic isolation stage (105), an auxiliary winding (L51-c) on the primary side (101) of the isolation stage (105) which is magnetically coupled to at least one secondary side winding (L51-b, L51-d) of the isolation stage (105), wherein the auxiliary winding (L51-c) is configured to detect a feedback signal as to a secondary side voltage, and a control unit (107) configured to sample the feedback signal, in each or every $n_{th}$ switching cycle, during a sampling period in which a current is flowing on the secondary side (103) of the isolation stage (105), and to process the sampled signal for a feedback control of the secondary side voltage by controlling the switching operation of a primary side switch (M40, M41).

10 Claims, 6 Drawing Sheets

(51) Int. Cl.
   *H02M 1/00* (2006.01)
   *H02M 3/00* (2006.01)
   *H02M 3/335* (2006.01)
   *H05B 45/382* (2020.01)

(52) U.S. Cl.
   CPC .......... *H02M 1/0058* (2021.05); *H02M 3/01* (2021.05); *H02M 3/33523* (2013.01); *H05B 45/30* (2020.01); *H05B 45/382* (2020.01)

(58) Field of Classification Search
   CPC ......... H02M 3/33523; H02M 3/33571; H02M 1/0009; H02M 1/0058; G11C 27/02
   See application file for complete search history.

(56) References Cited

OTHER PUBLICATIONS

Peng Fang et al., "A Single-Stage Primary-Side-Controlled Off-line Flyback LED Driver With Ripple Cancellation", IEEE Transactions on Power Electronics, Institute of Electrical and Electronics Engineers, USA, vol. 32, No. 6, Jun. 1, 2017, pp. 4700-4715.

Wang Chong et al., "Novel Digital Control Method For Improving Dynamic Responses of Multimode Primary-Side Regulation Flyback Converter", IEEE Transactions on Power Electronics, Institute of Electrical And Electronics Engineers, USA, vol. 32, No. 2, Feb. 17, 2017, pp. 1457-1468.

PCT/EP2020/081124, International Search Report and Written Opinion dated Jan. 14, 2021, 14 pages.

* cited by examiner

ISOLATED PRIMARY SIDE SWITCHED CONVERTER

CROSS REFERENCE TO RELATED APPLICATIONS

The present application is the U.S. national stage application of international application PCT/EP2020/081124 filed Nov. 5, 2020, which international application was published on May 27, 2021 as International Publication WO 2021/099131 A1. The international application claims priority to European Patent Application No. 19209652.7 filed Nov. 18, 2019.

FIELD OF THE INVENTION

The invention relates to an isolated primary side switched converter and a method for operating such a converter. The invention further relates to a driver for light sources.

BACKGROUND OF THE INVENTION

Converters, such as primary side switched converters, are generally known. Such converters can convert a DC signal of a first level, e.g. an input current, to a DC signal of a second level, e.g. an output current.

Primary side switched converters generally comprise a transformer which is arranged between a primary and a secondary side of the converter, wherein both sides are galvanically isolated from each other, and wherein the primary side comprises at least one switch. Such a converter can be referred to as an isolated primary side switched converter. If such isolated converter contains a network of inductors and capacitors which may be tuned to resonate at a specific frequency it is an isolated resonant primary side switched converter. A half bridge LLC converter is an example for such a resonant converter.

Primary side switched converters can be used to drive loads, such as LEDs. They, for instance, form a DC/DC stage that directly supplies the LED load with a LED current, respectively voltage. Alternatively, they can form an intermediate DC/DC stage that provides an input voltage for another DC/DC stage, which in turn supplies the LED load.

In order to react to under- and overvoltage situations, for instance caused by a short circuit of the LED lead, or by no LED connection and a resulting open load at the output side, an output voltage of the converters can be monitored with a control logic on the primary side.

For this purpose, a voltage divider and an optocoupler can be arranged at the secondary side of the converter, the latter transferring information about the output voltage to the primary side of the converter. However, this solution has the disadvantage of being complex and expensive.

Alternatively, the LED voltage can be monitored by a sense winding on the primary side. The sense winding can receive a voltage signal that directly relates to the output voltage.

In order to properly determine the output voltage based on the rectangular signal, it is known to first rectify the signal to remove the negative portions of the signal, and subsequently smooth the signal by a slow low-pass filter. This signal processing is performed continuously.

However, this approach has the disadvantage of being relatively slow. A possible reaction to under- and overvoltage situations is therefore delayed by the slow filtering.

Thus, it is an objective of the invention to provide an improved isolated resonant primary side switched converter, an improved method for operating such an inverter and an improved driver for light sources comprising such a converter, which avoid the above-mentioned disadvantages. In particular, it is the object of the invention to provide an isolated resonant primary side switched converter with a fast and accurate feedback control, which allows reacting to sudden changes of the output voltage.

SUMMARY OF THE INVENTION

The object of the present invention is achieved by the solution provided in the enclosed independent claims. Advantageous implementations of the present invention are further defined in the dependent claims.

According to a first aspect, the invention relates to an isolated resonant primary side switched converter, comprising a galvanic isolation stage, an auxiliary winding on the primary side of the isolation stage which is magnetically coupled to at least one secondary side winding of the isolation stage, wherein the auxiliary winding is configured to detect a feedback signal as to a secondary side voltage, and a control unit configured to sample the feedback signal, in each or every $n^{th}$ switching cycle, during a sampling period in which a current is flowing on the secondary side of the isolation stage, and to process the sampled signal for a feedback control of the secondary side voltage by controlling the switching operation of a primary side switch. This provides the advantage that a fast and accurate feedback control is achieved, which can react to sudden changes of the secondary side voltage.

In particular, the control unit is configured to sample the feedback signal in a cycle by cycle manner, wherein the sampling periods are chosen in such a way, that the secondary side voltage has a constant amplitude at the time of sampling. In this way, a reliable and delay-free sampling of the secondary side voltage can be achieved.

The secondary side voltage can be an output voltage of the isolated resonant primary side switched converter. This output voltage can be supplied to a LED load or to another converter, which in turn can supply a LED load.

The feedback signal can represent the secondary side voltage. In particular, the feedback signal comprises a voltage signal. The feedback signal can be a rectangular signal.

The control unit can be implemented as an integrated circuit or comprises a semiconductor integrated circuit. In another embodiment, the control unit is implemented as a processor, microprocessor, controller, microcontroller, application specific integrated circuit (ASIC), or a combination of the foregoing components.

The primary side switch can be a high and/or a low potential switch on the primary side of the isolation stage. In particular, the primary side can comprise two switches, and the control unit can be configured to control the switching operation of both switches on the primary side.

The feedback signal can be sampled in every switching cycle of the primary side switched converter. Alternatively, the feedback signal can be sampled in only every $2^{nd}$, $3^{rd}$, $4^{th}$, etc. switching cycle of the converter.

The sampling can be performed while a high potential switch, and/or while a low potential switch on the primary side of the converter is deactivated.

The switching cycle can be separated in a charging phase and a discharging phase. Preferably, during the charging phase, a transformer of the converter is charged, and subsequently, during the discharging phase, the transformer is discharged and current is flowing on the secondary side of the converter.

In an embodiment, the isolated resonant primary side switched converter is a LLC converter, in particular a LLC resonant half bridge converter.

In an embodiment, the control unit is configured to determine the secondary side voltage based on the feedback signal. This provides the advantage that the secondary side voltage can be monitored in a delay-free and accurate way on the primary side.

The feedback signal voltage can be a fraction of the secondary side voltage, for instance half of the secondary side voltage.

In an embodiment, the feedback signal is an AC signal, in particular a unipolar or a bipolar signal.

In particular, the feedback signal is a non-DC voltage.

In an embodiment, the converter further comprises a sensing unit on the primary side of the isolation stage, wherein the sensing unit is configured to directly or indirectly sense if a current is flowing on the secondary side of the isolation stage. This provides the advantage that an optimal sampling period in each cycle can be determined efficiently.

The sampling periods can be detected directly by the sensing unit as the periods during which current is flowing on the secondary side of the isolation stage. Subsequently the sampling of the feedback signal can be performed. With this approach, problems that could arise with an unstable signal can be avoided, as the starting points and/or lengths of the sampling periods do not have to be estimated.

In an embodiment, the converter comprises diodes or controllable switches on the secondary side of the isolation stage, wherein the sensing unit is configured to determine the sampling period, in each or every $n^{th}$ switching cycle, if at least one of the diodes or at least one of the controllable switches is in a conducting state. This provides the advantage that the sampling period in each cycle can be determined efficiently.

The sensing unit can be configured to directly sense whether at least one diode or at least one controllable switch on the secondary side of the isolation stage are in a conducting state. For this purpose, the sensing unit can be configured to directly receive a measurement signal from the diodes, respectively controllable switches, for instance, via a resonant or a magnetic coupling to the secondary side of the isolation stage, and/or via an optocoupler.

In an embodiment, the secondary side of the isolation stage comprises a rectification circuit, wherein the sensing unit is configured to determine the sampling period in each or every $n^{th}$ switching cycle, if current flows through the rectification circuit. This provides the advantage that the sampling period in each cycle can be determined efficiently.

The rectification circuit can comprise two or four diodes. Alternatively, the rectification circuit can comprise controllable switches. The sensing unit can be configured to directly receive a measurement signal from the rectification circuit.

The rectification circuit can be a full wave rectification circuit comprising four diodes, respectively four controllable switches. The sensing unit can be configured to detect the sampling periods during which the current is flowing on the secondary side by monitoring whether the opposing diodes, respectively opposing controllable switches, of the full wave rectification circuit are in a conducting state.

In an embodiment, the sensing unit comprises a shunt, which is in series with a switch, in particular a low potential switch, of the converter. This provides the advantage that the sensing unit can be provided on the primary side in a simple way and with only a few components. The low potential switch can be one of two switches on the primary side of the isolation stage.

In an embodiment, the control unit is configured to sample the feedback signal if a current through the shunt during a conducting state of the switch, in particular the low potential switch, meets a predefined criterion. This provides the advantage that the sampling period in each cycle, in particular the start of the sampling period in each cycle, can be determined efficiently.

In an embodiment, the predefined criterion is a zero crossing of the current through the shunt. This provides the advantage that the sampling period in each cycle, in particular the start of the sampling period in each cycle, can be determined efficiently.

In an embodiment, the secondary side of the converter comprises two windings in series, wherein the auxiliary winding is magnetically coupled to the two windings. This provides the advantage that the feedback signal can be detected efficiently by the auxiliary winding.

According to a second aspect, the invention relates to a driver for light sources, in particular LEDs, comprising the isolated resonant primary side switched converter according to the first aspect of the invention. This provides the advantage that a driver with a converter is provided, which can react to sudden changes of its output voltage.

The driver can comprise a boost PFC circuit which is coupled to the primary side of the converter and which provides an input voltage.

According to a third aspect, the invention relates to a method for operating an isolated resonant primary side switched converter, wherein the isolated resonant primary side switched converter comprises a galvanic isolation stage, the method comprising the steps of: detecting a feedback signal as to a secondary side voltage of the converter, on a primary side of the isolation stage, sampling the feedback signal, in each or every $n^{th}$ switching cycle, during a sampling period in which current is flowing on the secondary side of the isolation stage, and processing the sampled feedback signal for a feedback control of the secondary side voltage by controlling the switching operation of a primary side switch. This provides the advantage that a fast and accurate feedback control is achieved, which can react to sudden changes of the secondary side voltage.

In an embodiment, the step of processing the sampled signal comprises determining the secondary side voltage of the converter based on the sampled feedback signal. This provides the advantage that the secondary side voltage, e.g. an output voltage, can be determined efficiently.

In an embodiment, the method further comprises the step of determining the sampling period, in particular the start of the sampling period, in each or every $n^{th}$ switching cycle. This provides the advantage, that a suitable sampling period for each new cycle can be determined, and, hence, an accurate sampling can be performed.

Preferably, the start of the sampling period can be determined by detecting a zero crossing of a current through a shunt on the primary side of the converter during a conducting state of a switch, in particular a low potential switch, of the converter.

BRIEF DESCRIPTION OF THE DRAWINGS

The invention will be explained in the followings together with the figures.

DETAILED DESCRIPTION

Aspects of the present invention are described herein in the context of a primary side switched converter.

The present invention is described more fully hereinafter with reference to the accompanying drawings, in which various aspects of the present invention are shown. This invention however may be embodied in many different forms and should not be construed as limited to the various aspects of the present invention presented through this disclosure. Rather, these aspects are provided so that this disclosure will be thorough and complete, and will fully convey the scope of the present invention to those skilled in the art. The various aspects of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus.

Various aspects of an isolated resonant primary side switched converter will be presented. However, as those skilled in the art will readily appreciate, these aspects may be extended to aspects of converters in general without departing from the invention.

The term "LED luminaire" shall mean a luminaire with a light source comprising one or more LEDs. LEDs are well-known in the art, and therefore, will only briefly be discussed to provide a complete description of the invention.

It is further understood that the aspect of the present invention might contain integrated circuits that are readily manufacturable using conventional semiconductor technologies, such as complementary metal-oxide semiconductor technology, short "CMOS". In addition, the aspects of the present invention may be implemented with other manufacturing processes for making optical as well as electrical devices. Reference will now be made in detail to implementations of the exemplary aspects as illustrated in the accompanying drawings. The same references signs will be used throughout the drawings and the following detailed descriptions to refer to the same or like parts.

Figure 1:
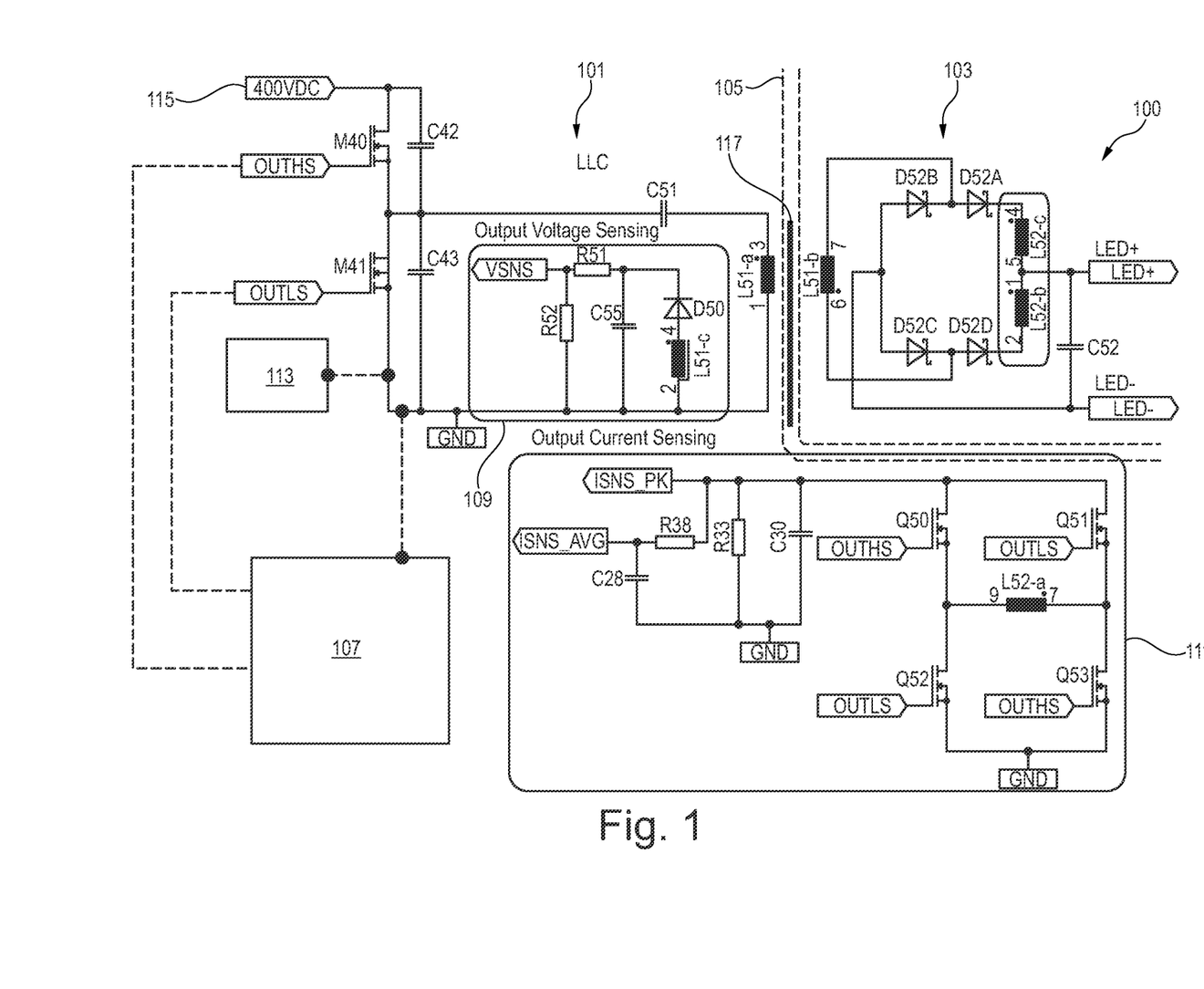
FIG. 1 shows a schematic diagram of a primary side switched converter according to an embodiment.

FIG. 1 shows a schematic diagram of an isolated resonant primary side switched converter 100 according to an embodiment.

The converter 100 comprises a galvanic isolation stage 105, an auxiliary winding L51-c on the primary side 101 of the isolation stage 105 which is magnetically coupled to at least one secondary side winding L51-b of the isolation stage, wherein the auxiliary winding L51-c is configured to detect a feedback signal as to a secondary side voltage. The converter 100 further comprises a control unit 107 configured to sample the feedback signal, in each or every $n^{th}$ switching cycle, during a sampling period in which a current is flowing on the secondary side 103, and to process the sampled signal for a feedback control of the secondary side voltage by controlling the switching operation of a primary side switch M40, M41.

Generally, the converter 100 in FIG. 1 is configured to receive an input current form an external current or voltage source at an input terminal 115 on the primary side 101 and to convert this input current from a first voltage level to an output current of a second voltage level on the secondary side 103 of the converter 100. The output current can then be supplied to an LED load connected to the output terminals LED+, LED−. The LED load can comprise one or several LED luminaires which can be driven by the output current.

In the exemplary embodiment of FIG. 1, the converter 100 is a half bridge LLC converter. Alternatively, the converter can be any type of resonant primary side switched converter, e.g. half bridge LCC converter.

In an embodiment, the primary side 101 of the converter 100 further comprises a primary-side winding L51-a, and the secondary side 103 comprises a secondary side winding L51-b, whereas these windings L51-a, L51-b together with a transformer core 117 form a transformer of the converter 100. By means of this transformer, current can be transmitted from the primary side 101 to the secondary side 103 of the converter 100. The primary side winding L51-a and the secondary side winding L51-b can be electrically isolated and magnetically coupled.

In an embodiment, the primary side 101 comprises two switches M40, M41. The switches M40, M41 can be configured to transform an input voltage signal into a square wave signal. For instance, the square wave is generated by driving the switches M40, M41, with offset switching cycles.

In particular, the switches M40, M41 can be separated in a high potential switch M40 respectively high-side FET M40, and a low potential switch M41 respectively low side FET M41.

Preferably, the switches M40, M41 are FETs, in particular MOSFETs.

In an embodiment, the primary side further comprises two capacitors C42, C43 that are configured to divide the input voltage. The primary side can comprise a further capacitance C51, which can be a resonant capacitance of the converter 100.

The primary side winding L51-a and the resonant capacitance C51 may form a part of the resonant tank of the isolated resonant primary side switched converter 100.

In an embodiment, the secondary side 103 comprises a rectification circuit. In the exemplary embodiment of FIG. 1, this rectification circuit is a full-wave rectifier, comprising four diodes D52A, D52B, D52C, D52D. Alternatively, the rectification circuit can comprise controllable switches instead of diodes.

Preferably, the secondary side comprises a capacitor C52 that is connected between the output terminals LED+, LED−.

In an embodiment, the converter 100 further comprises an output voltage sensing unit 109 on the primary side 101 of the isolation stage 105. The output voltage sensing unit 109 can comprise the auxiliary winding L51c which detects the feedback signal.

The output voltage sensing unit 109 can further comprise a diode D50 for rectifying the detected feedback signal, and a low-pass filter comprising the capacitor C55 and the resistances R51, R52. The capacitor C55 and resistances R51, R52 can be configured to filter and down-scale the sensed feedback signal to logic levels, e.g. 0 to 3.3 V, that can be measured by an ADC of an ASIC or microcontroller.

The control unit can receive the feedback signal from the auxiliary winding L51-c, for instance via a pin of the output voltage sensing unit 109. At least for certain time periods, the feedback signal can correspond to the secondary side voltage, in particular the output voltage, of the converter 100.

The control unit can be configured for a feedback control of the secondary side voltage by controlling the switching operation of the primary side switches M40, M41. Hence, the control unit can be configured to control the switches M40, M41 of the converter 100.

In an embodiment, the control unit 107 is implemented as an integrated circuit or comprises a semiconductor integrated circuit. In another embodiment, the control unit 107 is implemented as a processor, microprocessor, controller, microcontroller, application specific integrated circuit (ASIC), or a combination of the foregoing components.

The control unit 107 can be configured to determine the secondary side voltage during each sampling period based on the feedback signal.

The feedback signal can be an AC signal. In particular, the feedback signal is a unipolar signal or a bipolar signal.

The converter 100 can further comprise a sensing unit 113 on the primary side 101 of the isolation stage 105. The sensing unit can be configured to directly or indirectly sense if a current is flowing on the secondary side 103 of the isolation stage 105.

In the exemplary embodiment of FIG. 1, a current is flowing on the secondary side 103 of the isolation stage 105 if the rectifier diodes D52A and D52C, or the rectifier diodes D52B and D52D are in a conducting state.

In an embodiment, the sensing unit 113 is configured to directly receive a measurement signal from the rectifier diodes D52a, D52b, D52C, D52D of the secondary side 103, and to determine whether these diodes are in a conducting state based on the measurement signal.

In other words, the sensing unit 113 is configured to determine if current is flowing through the rectification circuit.

The sensing unit 113 can be configured to receive the measurement signal via a resonant or magnetic coupling to the secondary 103 side of the isolation stage 105, and/or via an optocoupler.

In an embodiment, upon detecting that current is flowing on the secondary side 103 of the isolation stage 105, the feedback signal is sampled by the control unit 107.

In other words, the sampling of the feedback signal can be performed at times when the feedback signal corresponds to the secondary side voltage. During these periods, the feedback signal has a constant amplitude and the corresponding diodes D52a and D52c, or D52d and D52b are in a conducting state.

In the exemplary embodiment of FIG. 1, the converter 100 comprises an optional output current sensing unit 111 on the primary side 101 of the isolation stage 105. The output current sensing unit can comprise a further winding L52-a which can be coupled to two corresponding windings L52-b, L52-c on the secondary side 103 of the isolation stage 105. The output current sensing unit 111 can comprise further components, such as switches Q50, Q51, Q52, Q53, resistors R33, R38 and conductors C30, C28.

Figure 2:
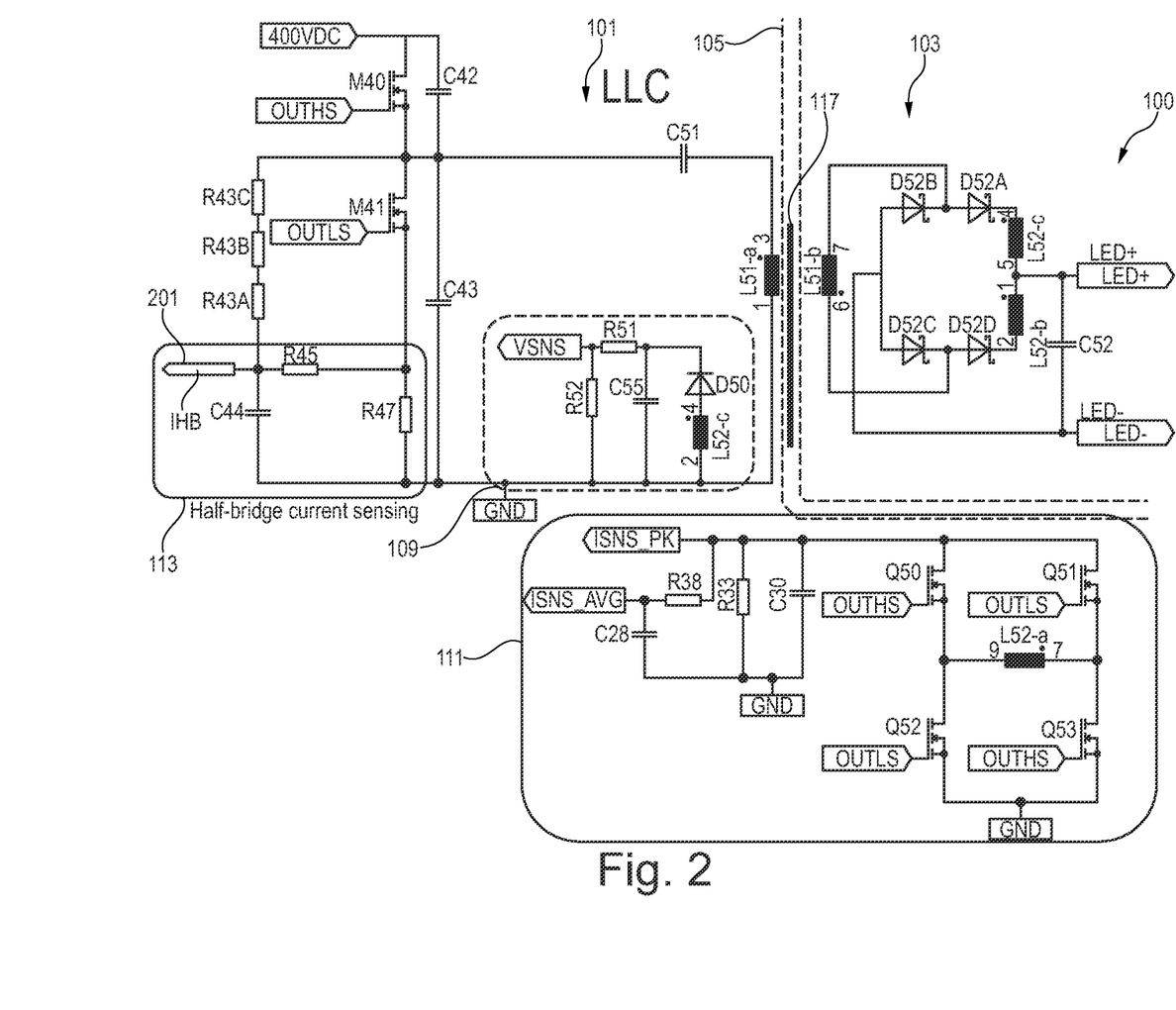
FIG. 2 shows a schematic diagram of a primary side switched converter according to an embodiment.

FIG. 2 shows a schematic diagram of a primary side switched converter 100 according to another embodiment.

The control unit 107 on the primary side 101 of the isolation stage 105 is not depicted in the exemplary embodiment of FIG. 2.

In FIG. 2, the sensing unit 113 comprises a shunt which is in series with the low potential switch M41 on the primary side 101.

The control unit 107 can be configured to monitor a current signal ($I_{IHB}$) from the sensing unit 113, and to determine the sampling period during each or every $n^{th}$ switching based on the current signal ($I_{IHB}$) In particular, the current signal ($I_{IHB}$) corresponds to the current through the shunt R47.

To receive the current signal ($I_{IHB}$), the control unit 107 can be connected to an output pin 201 of the sensing unit 113.

Preferably, the control unit 107 is configured to sample the feedback signal during each or every $n^{th}$ switching cycle, if the low potential switch M41 is in a conducting state and the current through the shunt R47 meets a predefined criterion.

In particular, the control unit 107 is configured to start sampling the feedback signal during each or every $n^{th}$ switching cycle, if the low potential switch M41 is in a conducting state and the current through the shunt R47 meets a predefined criterion.

The predefined criterion is a zero crossing, in particular a negative zero crossing or a positive zero crossing, of the current through the shunt R47.

In particular, starting with this zero crossing of the current through the shunt R47, current is flowing on the secondary side 103 of the isolation stage 105. The control unit 107 can be configure, to initiate a new sampling period at this point.

The sensing unit 113 can further comprise a resistor R45 and a capacitor C44, which are arranged to filter the current signal.

In the embodiment of FIG. 2, the converter 100 comprises further resistances R43A, R43B, R43C that form a voltage divider together with the resistances R45, R47 of the sense unit 11. The voltage divider can be configured to monitor a voltage from the drain of the low potential switch M41 to ground if the low potential switch M41 is switched off. This voltage can correspond to a half-bridge middle point voltage. At least starting with this zero crossing, the corresponding secondary side diode is conducting.

Figure 3:
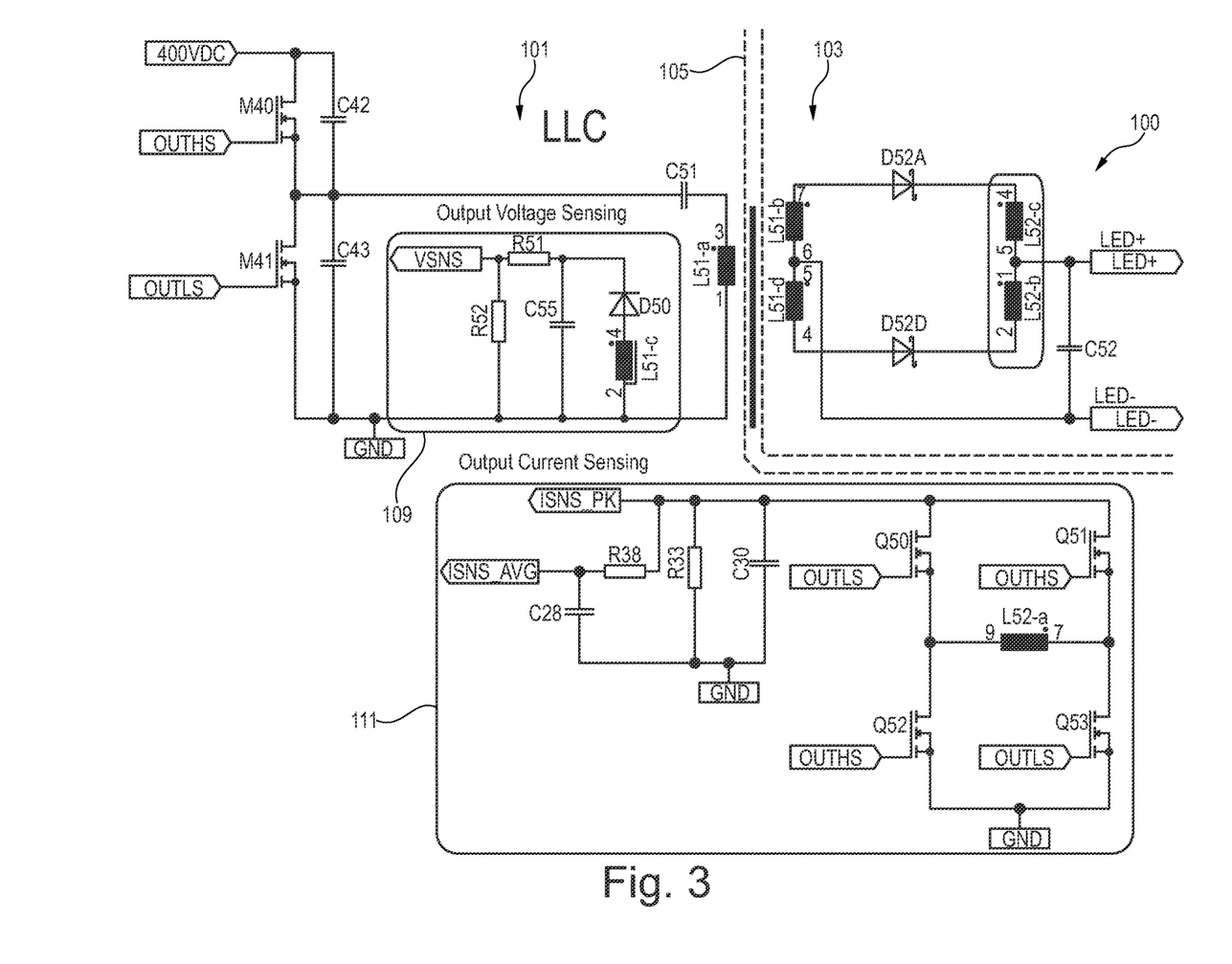
FIG. 3 shows a schematic diagram of a primary side switched converter according to an embodiment.

FIG. 3 shows a schematic diagram of a primary side switched converter 100 according to another embodiment.

In FIG. 3, the primary side switched converter 100 is an LLC half bridge converter, which comprises two secondary side windings L51b, L51d in series. The auxiliary winding L51-c can be magnetically coupled to both secondary side windings L51b, L51d.

The converter 100 in FIG. 3 further comprises a rectification circuit on its secondary side 103 with two diodes D52A, D52D.

The sensing unit 113, which is not shown in FIG. 3, can be configured to detect if at least one of the diodes D52A, D52D on the secondary side 103 is in a conducting state.

Figure 4:
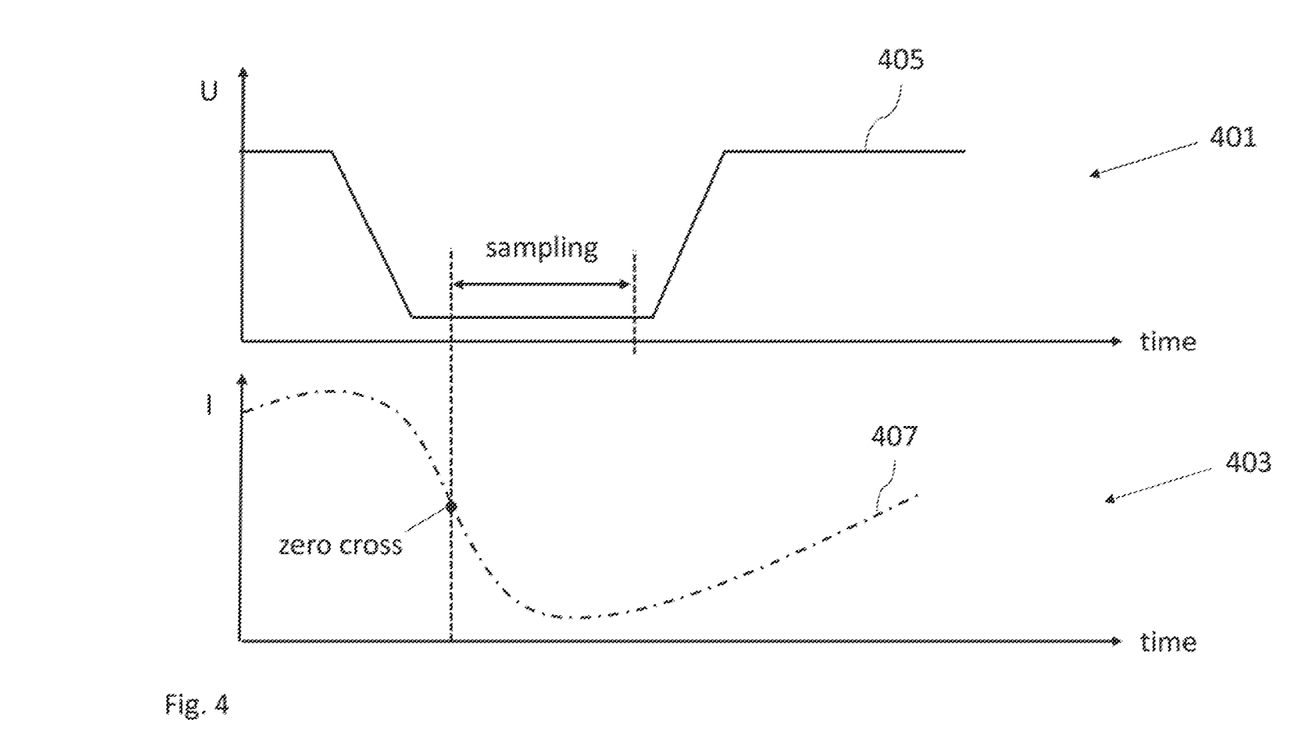
FIG. 4 shows schematic plots of voltage and current signals according to an embodiment.

FIG. 4 shows schematic plots 401, 402 of voltage and current signals according to an embodiment.

The upper plot 401 in FIG. 4 shows the feedback signal 405 detected at the sense winding L51-c. The lower plot 403 in FIG. 4 shows the current 407 through the shunt R47. The vertical line indicates a zero crossing of the current 407 through the shunt R47.

In FIG. 4, the feedback signal 405 is stable at the time of zero crossing of the current 407. This point in time can define the starting point for the sampling period. The feedback signal is, for instance, sampled for 500 ns starting from the point of zero crossing. This can be repeated for every or every $n^{th}$ switching cycle.

In an embodiment, the current signal 407 is forwarded to the control unit 107, via the output pin 201, which can utilize a comparator. This comparator can compare the signal to 0 V in order to detect the zero crossing.

Figure 5:
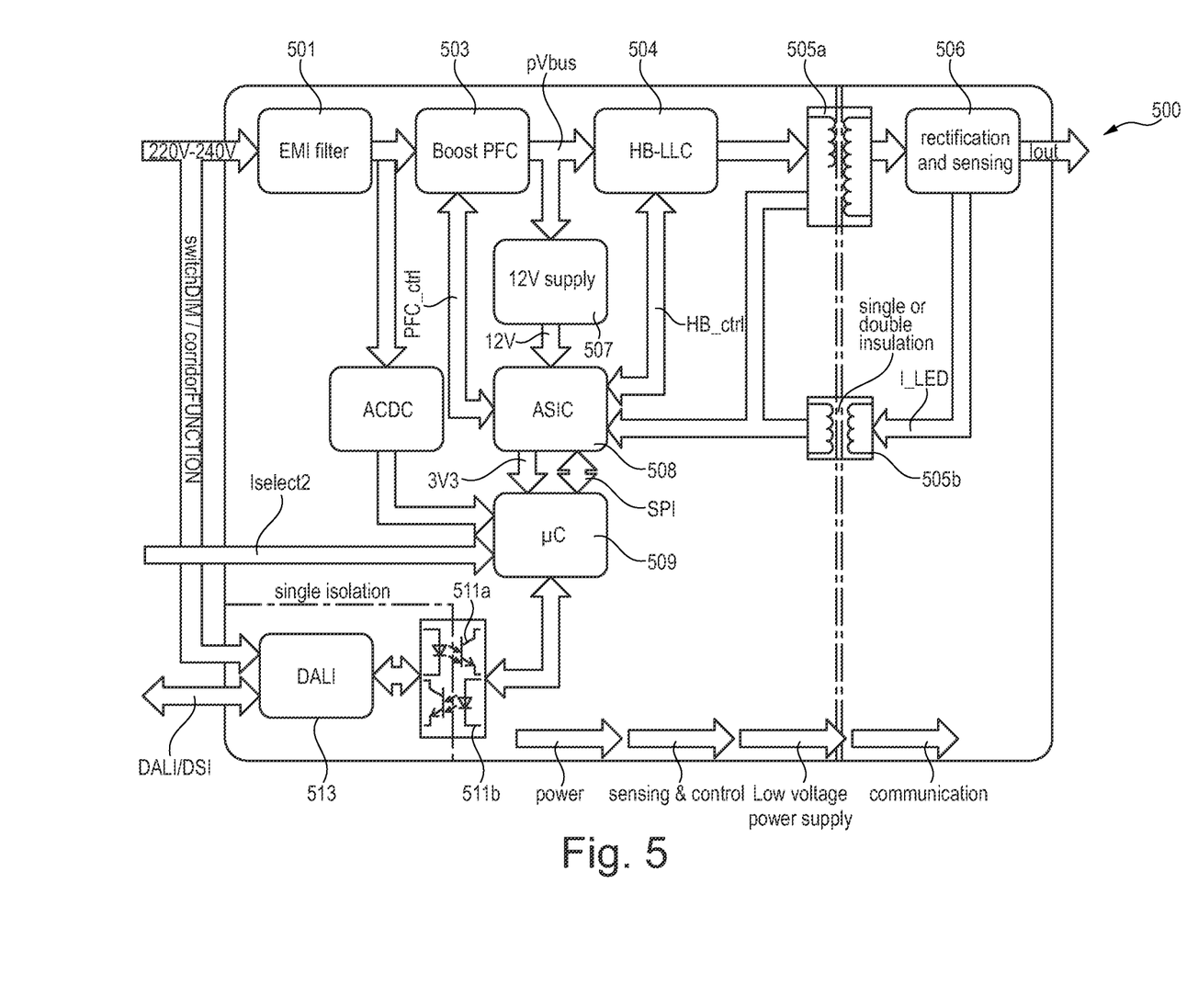
FIG. 5 shows a schematic representation of a driver for light sources according to an embodiment.

FIG. 5 shows a schematic representation of a driver 500 for light sources according to an embodiment. The light sources can be LED luminaires.

The driver 500 can comprise a converter 504, for instance a half bridge LLC converter. The converter 504 can be any one of the converters 100 of the FIGS. 1 to 3.

The driver 500 can further comprise an electromagnetic interference (EMI) filter 501, that forwards an input voltage to a PFC circuitry 503, in particular a boost PFC circuit. The PFC circuitry 503 can in turn supply the converter 504 with a bus voltage.

The driver 500 can further comprise an ASIC 508. The ASIC 508 can correspond to the control unit 107 or to a component of the control unit 107 from FIGS. 1 to 3. The ASIC 508 and can be configured to perform a feedback control of the secondary side voltage of the converter 504 and/or the PFC circuitry 503.

The driver 500 can further comprise a low voltage power supply 507 which can be configured to supply integrated circuits of the driver 500, e.g. the ASIC 508, with voltage.

The driver 500 can further comprise a microcontroller 509, which can be configured to control the ASIC 508. For instance, the microcontroller 509 can send signals to the ASIC 508 in order to control the ASIC 508, e.g. adjust a lamp brightness. Further, the microcontroller 509 can receive signals from the ASIC 508, e.g. lamp fault detection.

In an embodiment, the driver 500 comprises a rectification and sensing circuit 506, which is isolated from the other components of the driver 500 and coupled to the converter 504 and ASIC 508 via two transformers 505a, 505b.

The driver 500 can further comprise a DALI interface 513 which is optically isolated from the microcontroller 509. Signals can be exchanged between the DALI interface 513 and the microcontroller 509 via two optocouplers 511a, 511b.

Figure 6:
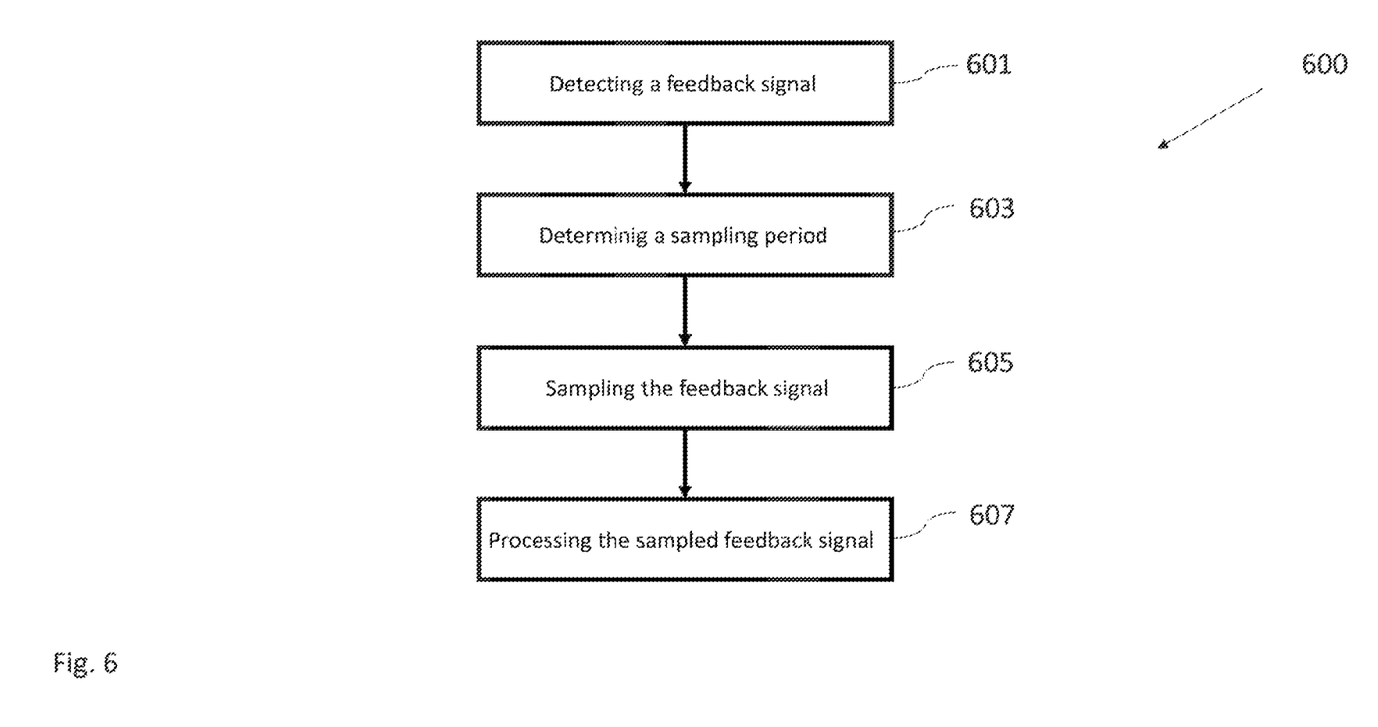
FIG. 6 shows a schematic diagram of a method for operating a primary side switched converter according to an embodiment.

FIG. 6 shows a schematic diagram of a method 600 for operating a primary side switched converter 100 according to an embodiment.

The method 600 comprises the steps of: detecting 601 a feedback signal as to a secondary side voltage of the converter 100, on a primary side 101 of an isolation stage 105 of the converter 100, sampling 605 the feedback signal, in each or every $n^{th}$ switching cycle, during a sampling period in which current is flowing on the secondary side 103 of the isolation stage 105, and processing 607 the sampled feedback signal for a feedback control of the secondary side voltage by controlling the switching operation of a primary side switch M41.

The method 600 can further comprise the step of determining 603 the sampling period, in particular the start of the sampling period, in each or every $n^{th}$ switching cycle. Preferably, this this determination 603 takes place on the primary side 101 of the isolation stage 105.

In particular, the step of determining 603 the sampling period is performed before sampling 605 the feedback signal. More particular, the step of determining 603 the sampling period is performed after detecting 601 the feedback signal.

The step of processing 607 the sampled signal comprises determining the secondary side voltage of the converter 100 based on the sampled feedback signal.

All features of all embodiments described, shown and/or claimed herein can be combined with each other.

While various embodiments of the present invention have been described above, it should be understood that they have been presented by way of example only and not limitation. Numerous changes to the disclosed embodiments can be made in accordance with the disclosure herein without departing from the spirit of scope of the invention. Thus, the breadth and scope of the present invention should not be limited by any of the above-described embodiments. Rather, the scope of the invention should be defined in accordance with the following claims and their equivalence.

Although the invention has been illustrated and described with respect to one or more implementations, equivalent alternations and modifications will occur to those skilled in the art upon the reading of the understanding of the specification and the annexed drawings. In addition, while a particular feature of the invention may have been disclosed with respect to only of the several implementations, such features may be combined with one or more other features of the other implementations as may be desired and advantage for any given or particular application.

The invention claimed is:

1. An isolated resonant primary side switched converter (100), comprising:
a galvanic isolation stage (105) separating a primary side and a secondary side,
an auxiliary winding (L51-c) on the primary side (101) of the isolation stage (105) which is magnetically coupled to at least one secondary side winding (L51-b, L51-d) of the isolation stage (105),
wherein the auxiliary winding (L51-c) is configured to detect a feedback signal corresponding to a secondary side voltage,
a control unit (107) configured to sample the feedback signal, in each or every $n^{th}$ switching cycle, during a sampling period in which a current is flowing on the secondary side (103) of the isolation stage (105), and to process the sampled feedback signal for a feedback control of the secondary side voltage by controlling the switching operation of a primary side switch (M40, M41); and
a sensing unit (113) on the primary side (101) of the isolation stage (105), wherein the sensing unit (113) is configured to directly or indirectly sense if a current is flowing on the secondary side (103) of the isolation stage (105), and wherein the sensing unit comprises a shunt (R47), which is in series with a low potential switch (M41) of the converter (100).

2. The converter (100) of claim 1, wherein the isolated resonant primary side switched converter (100) is a resonant half bridge LLC converter.

3. The converter (100) of claim 1, wherein the control unit (107) is configured to determine the secondary side voltage based on the feedback signal.

4. The converter (100) of claim 1, wherein the feedback signal is an AC signal.

5. The converter (100) of claim 1, further comprising diodes (D52A, D52B, D52C, D52D) or controllable switches on the secondary side (103) of the isolation stage (105), wherein the sensing unit is configured to determine the sampling period, in each or every $n^{th}$ switching cycle, if at least one of the diodes (D52A, D52B, D52C, D52D) or at least one of the controllable switches is in a conducting state.

6. The converter (100) of claim 1, wherein the secondary side (103) of the isolation stage (105) comprises a rectification circuit, wherein the sensing unit is configured to determine the sampling period in each or every $n^{th}$ switching cycle, if current flows through the rectification circuit.

7. The converter (100) of claim 1, wherein the control unit (107) is configured to sample the feedback signal if a current through the shunt (R47) during a conducting state of the switch (M41) meets a predefined criterion.

8. The converter (100) of claim 7, wherein the predefined criterion is a zero crossing of the current through the shunt (R47).

9. The converter (100) of claim 1, wherein the secondary side (103) of the converter (100) comprises two windings (L51-*b*, L51-*d*) in series, wherein the auxiliary winding (L51-*c*) is magnetically coupled to the two windings (L51-*b*, L51-*d*).

10. A driver (500) for light sources, in particular LEDs, comprising the isolated resonant primary side switched converter (100) of claim 1.

* * * * *